United States Patent
Suzuki et al.

(10) Patent No.: US 9,741,892 B2
(45) Date of Patent: Aug. 22, 2017

(54) SOLAR CELL MODULE PRODUCTION METHOD, AND SOLAR CELL MODULE ADHESIVE APPLICATION SYSTEM

(71) Applicant: Panasonic Intellectual Property Management Co., Ltd., Osaka-shi, Osaka (JP)

(72) Inventors: Satoshi Suzuki, Osaka (JP); Yoshiyuki Kudoh, Shiga (JP); Masaya Nakai, Shiga (JP); Haruhisa Hashimoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 26 days.

(21) Appl. No.: 14/825,453

(22) Filed: Aug. 13, 2015

(65) Prior Publication Data
US 2015/0349189 A1 Dec. 3, 2015

Related U.S. Application Data

(63) Continuation of application No. PCT/JP2014/000656, filed on Feb. 7, 2014.

(30) Foreign Application Priority Data

Feb. 28, 2013 (JP) .................................. 2013-039717

(51) Int. Cl.
*B05C 13/00* (2006.01)
*H01L 31/18* (2006.01)
(Continued)

(52) U.S. Cl.
CPC ...... *H01L 31/18* (2013.01); *H01L 31/022425* (2013.01); *H01L 31/0504* (2013.01); *Y02E 10/50* (2013.01)

(58) Field of Classification Search
None
See application file for complete search history.

(56) References Cited

U.S. PATENT DOCUMENTS

2008/0196757 A1 8/2008 Yoshimine
2015/0349189 A1* 12/2015 Suzuki .................. H01L 31/18
438/64

FOREIGN PATENT DOCUMENTS

EP 2624310 A1 8/2013
EP 2629336 A1 8/2013
(Continued)

OTHER PUBLICATIONS

International Search Report for corresponding International Application No. PCT/JP2014/000656; date of mailing: Mar. 11, 2014, with English translation.

*Primary Examiner* — Jack Chen
(74) *Attorney, Agent, or Firm* — Cantor Colburn LLP

(57) ABSTRACT

A solar cell module production method involves applying an adhesive on a light-receiving surface and a rear surface of a solar cell having electrodes on the light-receiving surface and the rear surface, and positioning and attaching a wiring material on the adhesive. Specifically, the solar cell, which is positioned with the light-receiving surface facing upward, is inverted so that the rear surface is facing upward, and the adhesive is applied on the rear surface; and then the solar cell is inverted once again so that the light-receiving surface is facing upward, and the adhesive is applied to the light-receiving surface.

2 Claims, 8 Drawing Sheets

(51) Int. Cl.
*H01L 31/0224* (2006.01)
*H01L 31/05* (2014.01)

(56) References Cited

FOREIGN PATENT DOCUMENTS

| | | | |
|---|---|---|---|
| JP | 2008205137 | A | 9/2008 |
| WO | 2012043491 | A1 | 4/2012 |
| WO | 2012049984 | A1 | 4/2012 |

* cited by examiner

SOLAR CELL MODULE PRODUCTION METHOD, AND SOLAR CELL MODULE ADHESIVE APPLICATION SYSTEM

TECHNICAL FIELD

This application is a continuation under 35 U.S.C. §120 of PCT/JP2014/000656, filed Feb. 7, 2014, which is incorporated herein reference and which claimed priority to Japanese Application No. 2013-039717, filed Feb. 28, 2013, the entire content of which is also incorporated herein by reference.

BACKGROUND ART

A solar cell module includes a plurality of solar cells, wiring members connecting the solar cells, encapsulant for sealing these members, and the like. The wiring member is adhered on an electrode of the solar cell, and solder has been primarily used for the adhesion. However, due to effects of heat during the soldering process, there may be cases where deflection of the solar cell or cracks may be caused. Such disadvantages appear more significantly as the thickness of the solar cell becomes thinner. Because of this, a method of adhering the wiring member and the solar cell using a resin adhesive (hereinafter simply referred to as an "adhesive") in place of the solder has been proposed (for example, Patent Document 1).

RELATED ART REFERENCE

Patent Document

[Patent Document 1] JP 2008-205137 A

DISCLOSURE OF THE INVENTION

Technical Problem

When electrodes are provided on both surfaces of the solar cell, the adhesive must be applied on both surfaces of the solar cell. In this process, depending on the application method of the adhesive, adverse effects on the performance of the solar cell module may be caused such as, for example, effects on appearance of the solar cell after the adhesive is applied, quality abnormality due to reduction of adhesion strength of the wiring member, degradation of the photoelectric conversion characteristic due to an increase in contact resistance of the wiring member, or the like. Therefore, in the manufacturing process of the solar cell module, it is important to employ an appropriate application method of the adhesive.

Solution to Problem

According to one aspect of the present invention, there is provided a method of manufacturing a solar cell module in which, for a solar cell having electrodes on a light receiving surface and on a back surface, an adhesive is applied over the light receiving surface and over the back surface, and a wiring member is placed and adhered over the adhesive, the method comprising: inverting the solar cell placed with the light receiving surface facing upward so that the back surface faces upward; applying the adhesive over the back surface and then inverting the solar cell again so that the light receiving surface faces upward; and applying the adhesive over the light receiving surface.

According to another aspect of the present invention, there is provided an adhesive application system for a solar cell module that applies an adhesive for adhering a wiring member over a light receiving surface and over a back surface of a solar cell, the system comprising: an application device that applies an adhesive over the light receiving surface and over the back surface; an inversion device that inverts the solar cell; and a control device, wherein the control device controls operations of the application device and the inversion device to invert the solar cell placed with the light receiving surface facing upward so that the back surface faces upward, to apply the adhesive over the back surface and then invert the solar cell again so that the light receiving surface faces upward, and to apply the adhesive over the light receiving surface.

Advantageous Effects of Invention

According to various aspects of the present invention, an appropriate application method of the adhesive may be realized, to improve performance characteristics of the solar cell modules such as, for example, the photoelectric conversion characteristic and appearance.

EMBODIMENT

A preferred embodiment of the present invention will now be described in detail with reference to the drawings.

The drawings referred to in the embodiment are schematically drawn, and the size ratios or the like of the elements drawn in the figures may differ from that of the actual structure. Specific size ratios or the like should be determined in consideration of the following description.

In the present disclosure, a "light receiving surface" refers to a surface through which solar light is primarily incident from outside of a solar cell. A "back surface" refers to a surface opposite to the light receiving surface. More specifically, of the solar light incident on the solar cell, more than 50% and up to 100% of the solar light is incident from the light receiving surface side.

The description "upward" refers to a vertically upward direction unless otherwise specified.

The descriptions "approximate " or approximately " are meant to include, for example, in the case of "approximately identical", not only structures which are completely identical, but also structures that are substantially identical.

Figure 1:
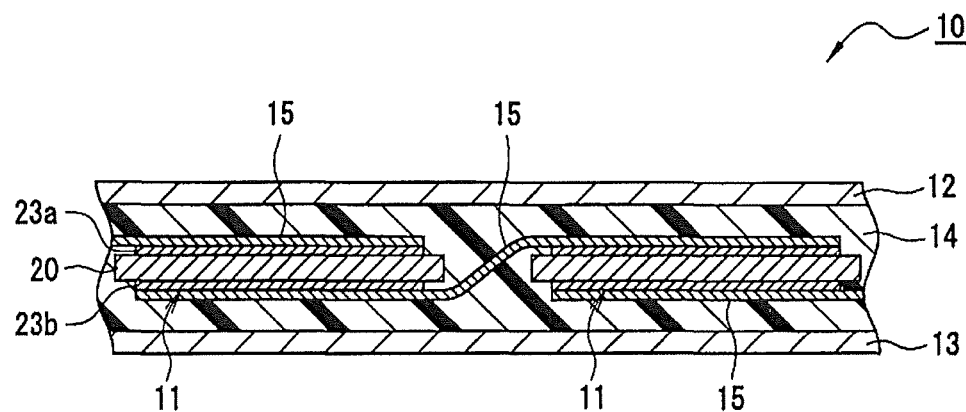
FIG. 1 is a cross sectional diagram of a solar cell module according to a preferred embodiment of the present invention.
Figure 2A:
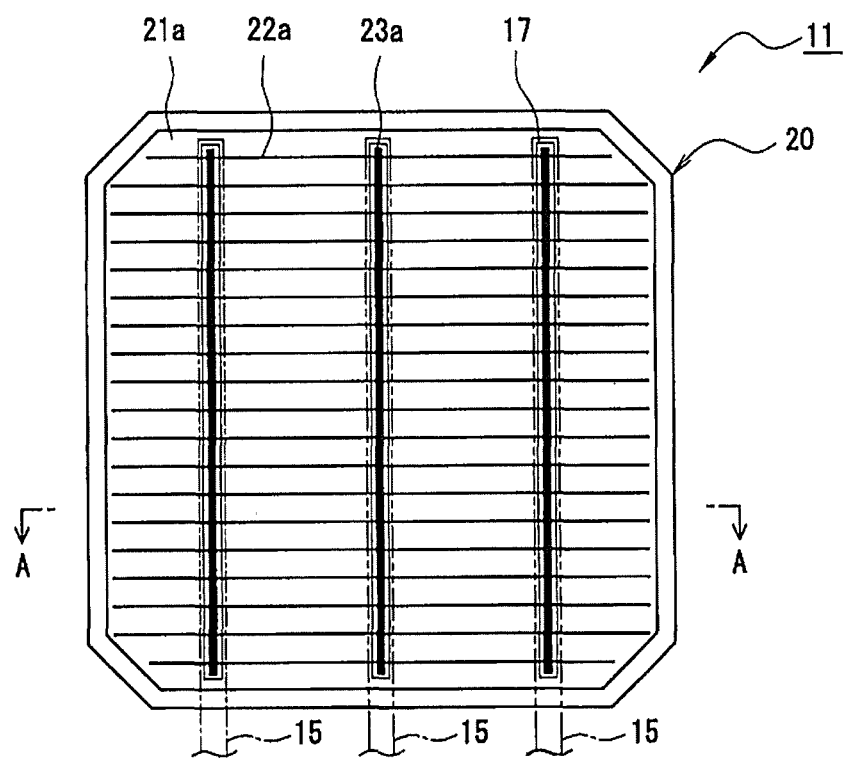
FIG. 2A is a diagram (front view) of a solar cell in the solar cell module of FIG. 1, viewed from a light receiving surface side.
Figure 2B:
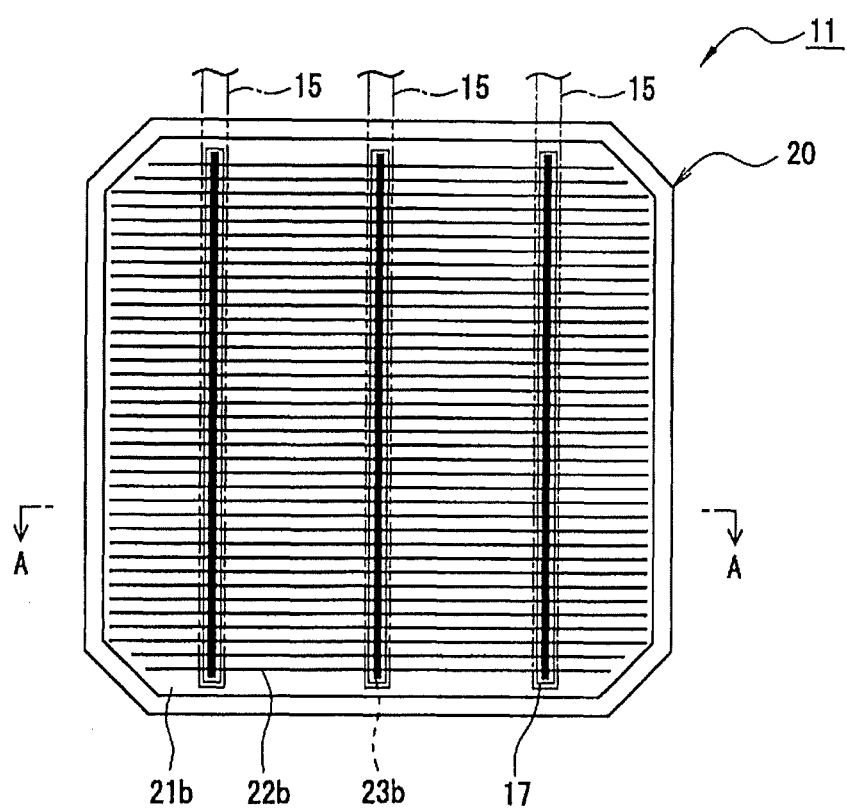
FIG. 2B is a diagram (back view) of the solar cell in the solar cell module of FIG. 1, viewed from a back surface side.

FIG. 1 is a cross sectional diagram of a solar cell module 10 according to a preferred embodiment of the present invention. FIGS. 2A and 2B are diagrams showing a solar cell 11 in the solar cell module 10, viewed from a light receiving surface side and a back surface side, respectively (a wiring member 15 is shown with a dot-and-chain line). In the following description, the solar cell module 10 explained with reference to FIGS. 1, 2A, and 2B is an example structure manufactured by the manufacturing method to be described later.

As shown in FIG. 1, the solar cell module 10 comprises a plurality of the solar cells 11, a first protection member 12 placed on a light receiving surface side of the solar cell 11, and a second protection member 13 placed on a back surface side of the solar cell 11. The plurality of solar cells 11 are sandwiched by the protection members 12 and 13, and are also sealed by an encapsulant such as ethylene vinyl acetate copolymer (EVA). For the protection members 12 and 13, a member having a light transmissive characteristic such as, for example, a glass substrate, a resin substrate, a resin film, or the like may be employed. When incidence of light from the back surface side does not need to be taken into consideration, a member which does not have light transmissive characteristic may be used for the protection member 13. The solar cell module 10 further comprises the wiring member 15 that electrically connects the solar cells 11, and a frame, a terminal box, or the like (not shown).

The solar cell 11 comprises a photoelectric conversion unit that generates carriers by receiving solar light. The photoelectric conversion unit 20 comprises a semiconductor substrate made of, for example, crystalline silicon (c-Si), gallium arsenide (GaAs), indium phosphide (InP), or the like, and an amorphous semiconductor layer formed over the substrate. In addition, the photoelectric conversion unit 20 preferably comprises transparent conductive layers 21a and 21b formed over the amorphous semiconductor layer. As a specific example structure, a structure may be exemplified in which, over a light receiving surface of an n-type monocrystalline silicon substrate, an i-type amorphous silicon layer, a p-type amorphous silicon layer, and a transparent conductive layer 21a are sequentially formed in this order, and over a back surface, an i-type amorphous silicon layer, an n-type amorphous silicon layer, and a transparent conductive layer 21b are sequentially formed in this order. The transparent conductive layers 21a and 21b are preferably formed by a transparent conductive oxide in which a metal oxide such as indium oxide ($In_2O_3$) and zinc oxide (ZnO) is doped with tin (Sn), antimony (Sb), or the like.

As shown in FIGS. 2A and 2B, over the photoelectric conversion unit 20, a finger electrode 22a and a bus bar electrode 23a are formed as a light receiving surface electrode, and a finger electrode 22b and a bus bar electrode 23b are formed as a back surface electrode. The finger electrodes 22a and 22b are narrow line-shaped electrodes formed over a wide range over the transparent conductive layers 21a and 21b, respectively. The bus bar electrodes 23a and 23b are electrodes for collecting carriers from the finger electrodes 22a and 22b, respectively. When the bus bar electrodes 23a and 23b are provided, the wiring member 15 is attached to these electrodes.

In the present embodiment, three bus bar electrodes 23a are placed with a predetermined gap therebetween in an approximately parallel manner to each other, and a large number of finger electrodes 22a are placed approximately perpendicular to the bus bar electrodes 23a. All of the electrodes are formed in a straight line shape. The back surface electrode has an electrode placement similar to that of the light receiving surface electrode. However, because the effect of light blockage loss on the photoelectric conversion characteristic is lower at the back surface compared to the light receiving surface, the back surface electrode can be formed in a larger area than the light receiving surface electrode. For example, the back surface electrode has about twice to six times the electrode area of the light receiving surface electrode, and the number of finger electrodes 22b can be set greater than the number of finger electrodes 22a. In other words, it can be said that the "light receiving surface" is a surface having a smaller electrode area, and the "back surface" is a surface having a larger electrode area.

The electrode has a structure in which, for example, a conductive filler such as silver (Ag) is dispersed in a binder resin. The electrode having such a structure can be formed by screen printing, similar to an adhesive 17 to be described later. When incidence of light from the back surface side is not taken into consideration, for example, a metal layer such as Ag may be formed over approximately the entire region over the transparent conductive layer 21b, to form the back surface electrode.

The wiring member 15 is an elongated member that connects the solar cells 11 placed adjacent to each other. One end side of the wiring member 15 is attached to the bus bar electrode 23a of one solar cell 11 of the adjacent solar cells 11. The other end side of the wiring member 15 is attached to the bus bar electrode 23b of the other solar cell 11. In other words, the wiring member 15 is bent in the thickness direction of the solar cell module 10 between the adjacent solar cells 11, and connects the solar cells 11 in series.

Figure 5:
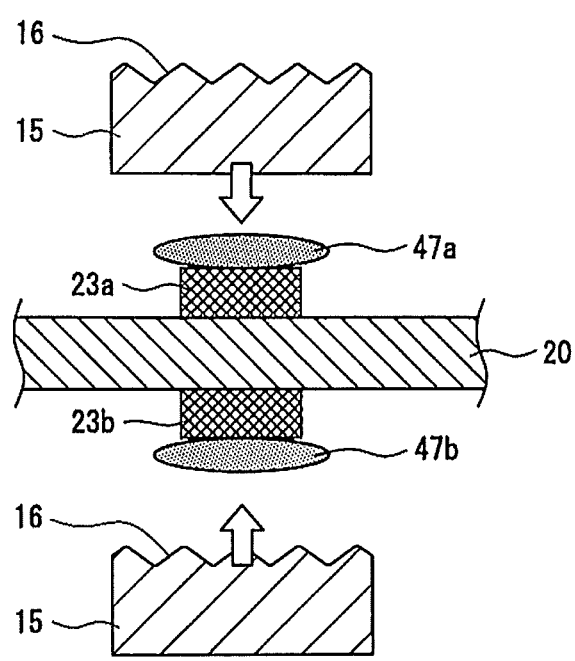
FIG. 5 is a diagram for explaining a manufacturing process of a solar cell module according to a preferred embodiment of the present invention.

The wiring member 15 preferably has one surface approximately flat and preferably has an unevenness (projections and depressions) 16 over the other surface (refer to FIG. 5). The wiring member 15 is placed such that the unevenness 16 faces the side of the protection member 12. More specifically, the flat surface of the wiring member 15 is adhered over the light receiving surface, and the surface with the unevenness 16 is adhered over the back surface. With such a placement, the light diffused by the unevenness 16 can again be reflected toward the side of the solar cell 11 by the protection member 12, and consequently light receiving efficiency of the solar cell 11 can be improved.

The wiring member 15 is adhered on the bus bar electrodes 23a and 23b using the adhesive 17. The elongated wiring members 15 are placed along the longitudinal direction of the bus bar electrodes 23a and 23b, and with the centers in the width directions being approximately matched with each other. The wiring member 15 is required to have strength to such a degree that the wiring member 15 is not cut at least during manufacture and usage. For this purpose, for example, the width of the wiring member 15 is set wider than the widths of the bus bar electrodes 23a and 23b. Because of this, the wiring member 15 is attached in a state where the wiring member 15 overhangs on both sides in the width direction of the bus bar electrode 23a and 23b.

For the adhesive 17, a thermoplastic adhesive, a thermosetting adhesive, a normal temperature curing adhesive (moisture curing adhesive, two-solution curing adhesive), and an energy ray curing adhesive (ultraviolet curing adhesive) may be used. Of these adhesives, the curing adhesive is preferable, and the thermosetting adhesive is particularly preferable. As the thermosetting adhesive, for example, a urea-based adhesive, a resorcinol-based adhesive, a melamine-based adhesive, a phenol-based adhesive, an epoxy-based adhesive, a polyurethane-based adhesive, a polyester-based adhesive, a polyimide-based adhesive, an acryl-based adhesive, or the like may be exemplified.

The adhesive 17 may contain a conductive filler such as the Ag particles, but from the viewpoint of reduction of the manufacturing cost and light blockage loss or the like, the adhesive 17 is preferably a non-conductive thermosetting adhesive that does not contain the conductive filler. The adhesive 17 before curing (hereinafter, the adhesive before curing will be referred to as an "adhesive 47") is in a liquid form. "Liquid form" refers to a state where the adhesive has fluidity at a normal temperature (25° C.), and is intended to include states such as a paste form and a gel form. Viscosity of the adhesive 47 is about 1 Pa·s~100 Pa·s, preferably about 2 Pa·s~40 Pa·s, and more preferably about 3 Pa·s~30 Pa·s. The manufacturing method to be described later is particularly preferable when, for example, the viscosity of the adhesive 47 is low.

The adhesive 17 preferably exists only between the wiring member 15 and the light receiving surface and between the wiring member 15 and the back surface. That is, preferably, the adhesive 17 is not squeezed out from the region between the wiring member 15 and the light receiving surface and the region between the wiring member 15 and the back surface, and there is no "fillet" where the adhesive is adhered to the side surface of the wiring member 15. It is not preferable for the wiring member 15 to be firmly adhered to the solar cell 11, but from the viewpoint of stress reduction or the like, preferably, the wiring member 15 is gently adhered to the solar cell 11 to a degree that the wiring member 15 is not detached during manufacture and usage. That is, while it is important to control the adhesion strength between the wiring member 15 and the solar cell 11 to an appropriate range, when the fillet is formed, it becomes difficult to control the adhesion strength because the adhesion by the fillet becomes dominant. In the present embodiment, because the adhesive is applied such that the adhesive is not squeezed out from the wiring member 15, the adhesion strength can be easily controlled to the appropriate range. The "stress" to be reduced is primarily the shearing stress that occurs at the interface between the wiring member 15 and the solar cell 11 due to a change in volume of the encapsulant 14 (expansion and contraction due to change of temperature).

Figure 3:
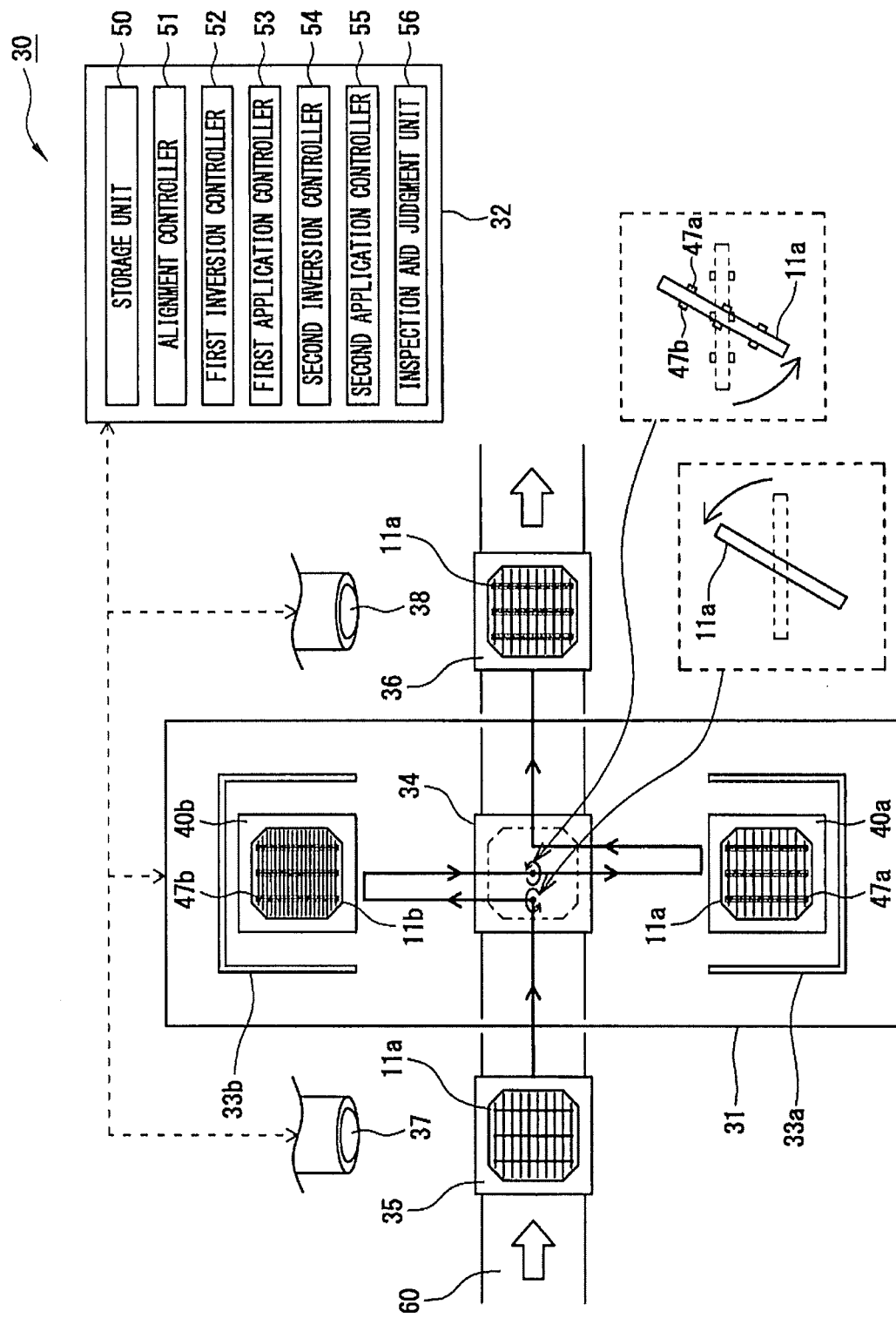
FIG. 3 is a diagram for explaining a manufacturing process of a solar cell module and an adhesive application system for a solar cell module according to a preferred embodiment of the present invention.
Figure 4A:
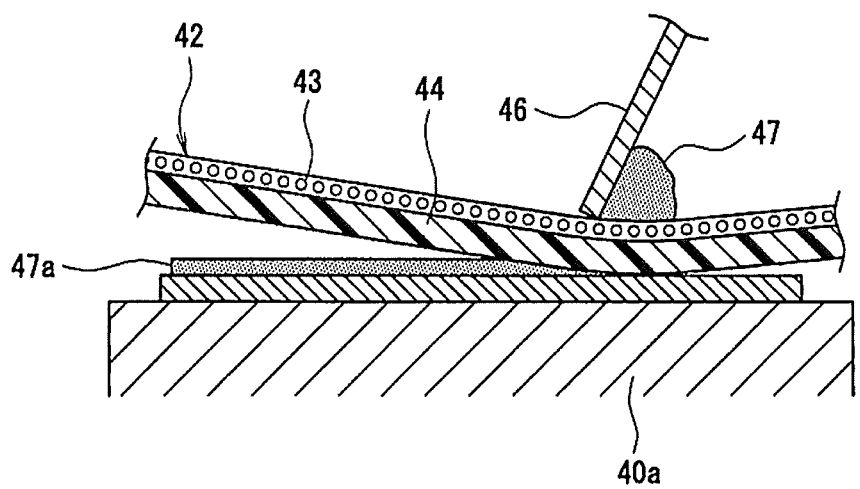
FIGS. 4A and 4B are diagrams showing an example of an application device of FIG. 3.
Figure 4B:
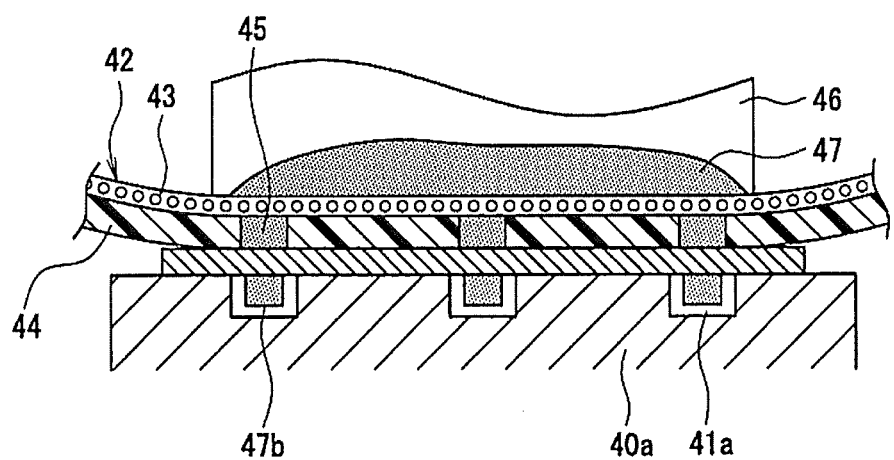

A manufacturing method of the solar cell module 10 and an adhesive application system 30 for a solar cell module (hereinafter referred to as "application system 30") according to a preferred embodiment of the present invention will now be described in detail with reference to FIGS. 3-5. FIG. 3 is a diagram showing a step of applying the adhesive 47, in the manufacturing process of the solar cell module 10, and also showing the application system 30. FIG. 4 is a diagram showing an example of an application device 33a, with FIG. 4A being a cross sectional diagram in which a screen plate 42 or the like is cut along a longitudinal direction of the bus bar electrodes 23a and 23b, and FIG. 4B being a cross sectional diagram in which the screen plate 42 or the like is cut along a direction perpendicular to the longitudinal direction. FIG. 5 is a diagram showing a step of adhering the wiring member 15. In FIG. 3, constitutent elements related to the light receiving surface are referred to with a sub-index "a", and the constitutent elements related to the back surface are referred to with a sub-index "b" (similarly, with regard to the solar cell 11, the light receiving surface will be referred to with reference numeral 11a and the back surface will be referred to with reference numeral 11b).

As shown in FIG. 3, the solar cell module 10 can be manufactured by a manufacturing line having the application system 3. The application system 30 is a system that constitutes a part of the manufacturing line of the solar cell module 10, and applies the adhesive 47 for adhering the wiring member 15 over the light receiving surface and the back surface of the solar cell 11. The wiring member 15 is attached to the solar cell 11 onto which the adhesive 47 is applied by the application system 30, and a string (refer to FIGS. 1 and 5) in which a plurality of solar cells 11 are connected by the wiring member 15 is manufactured. The string is transported to, for example, a lamination device (not shown), where a lamination process to be described later is applied, and the solar cell module 10 is manufactured.

The application system 30 preferably comprises an application and inversion unit 31, and a control device 32. The application system 30 preferably further comprises an alignment adjustment unit 35 and an inspection unit 36. The application and inversion unit 31 comprises, for example, an application device 33a that applies the adhesive 47 over the light receiving surface of the solar cell 11, an application device 33b that applies the adhesive 47 over the back surface, and an inversion device 34 that inverts the solar cell 11. The control device 32 preferably controls the operation of the application and inversion unit 31, and, at the same time, controls the operation of the entire system including the alignment adjustment unit 35 and the inspection unit 36.

The application and inversion unit 31 is a unit in which two application devices 33a and 33b and the inversion device 34 are placed proximate to each other, and gathered in a compact arrangement. In the present embodiment, the inversion device 34 is provided between the two application devices 33a and 33b. With such a configuration, the adhesive 47 can be quickly applied onto both surfaces of the solar cell 11. In addition, by gathering the application devices 33a and 33b and the inversion device 34 as a unit, the size of the application system 30 or the like can be reduced.

In the application devices 33a and 33b, stages 40a and 40b on which the solar cell 11 is placed are provided, respectively. The solar cell 11 is placed on the stages 40a and 40b, respectively, with surfaces to which the adhesive 47 is to be applied facing upward. In other words, the solar cell 11 placed on the stage 40a has the light receiving surface facing upward, and the solar cell 11 placed on the stage 40b has the back surface facing upward. In the following description, when it is necessary to distinguish the adhesive 47 applied over the light receiving surface and the adhesive 47 applied over the back surface, the former will be referred to as "adhesive 47a" and the latter will be referred to as "adhesive 47b".

As shown in FIG. 4, for the application devices 33a and 33b, preferably, screen printing devices are used from the viewpoint of productivity and the like. In FIG. 4, the application device 33a is shown, and a similar device may be used also for the application device 33b. As the screen printing device, a typical device having a screen plate 42, a squeegee 46, or the like may be employed. The screen plate 42 has a mesh 43 through which the adhesive 47 passes, and a mask member 44 provided on the mesh 43. The mask member 44 is formed, for example, by a photosensitive emulsion, and is provided leaving an opening 45 corresponding to the application pattern of the adhesive 47a or the adhesive 47b. In the screen printing, the adhesive 47 is placed over the screen plate 42, and the squeegee 46 is slid over the plate to eject the adhesive 47 through the opening 45 and print the adhesive 47 at target positions on the light receiving surface or the back surface. The opening 45 is formed corresponding to the shape of the bus bar electrode 23a or 23b. More specifically, in the screen plate 42, three elongated openings 45 are formed corresponding to the bus bar electrodes 23a or 23b. Each opening 45 has approximately the same length in the longitudinal direction as the length of the bus bar electrode 23a or 23b in the longitudinal direction, and a width which is wider than the width of the bus bar electrode 23a or 23b and narrower than the width of the wiring member 15. The squeegee 46 is slid along the longitudinal direction of the bus bar electrodes 23a and 23b.

On the stage 40a, preferably, a groove 41a corresponding to the formation pattern of the adhesive 47b is formed so that the adhesive 47b which is applied in advance in the application device 33b is not attached. In the present embodiment, three elongated grooves 41a are formed on the stage 40a.

As the inversion device 34, any inversion device may be used that has a function to turn the solar cell 11, having the light receiving surface facing upward, over so that the back surface faces upward, and a function to turn the solar cell 11, having the back surface facing upward, over so that the light receiving surface faces upward. Various devices with inversion mechanisms such as, for example, a mechanism to sandwich the solar cell 11 with two members and to invert the solar cell 11, a mechanism to invert the solar cell 11 using a sucking or adsorptive member, or the like may be suitably applied. In FIG. 3, the inversion device 34 is shown at the center of the application and inversion unit 31. Alternatively, for example, a waiting stage may be provided at the center of the application and inversion unit 31, and inversion mechanisms may be provided between the alignment adjustment unit 35 and the waiting stage and between the waiting stage and the application device 33a. On the stage of the inversion device 34, similar to the stage 40a, preferably, a structure for preventing attachment of the adhesive 47 is formed.

The alignment adjustment unit 35 preferably applies a positioning process to enable application of the adhesive 47 to the target application position (hereinafter referred to also as "alignment adjustment") with respect to the light receiving surface side of the solar cell 11. In the present embodiment, the alignment adjustment unit 35 is provided proximate to the upstream side (starting point side of the manufacturing line) of the application and inversion unit 31. The solar cell 11 used for the manufacture of the solar cell module 10 is transported into the alignment adjustment unit 35 by, for example, a transport line 60. In the present embodiment, because the damage and contamination on the light receiving surface side more significantly affects the photoelectric conversion characteristic than those of the back surface side, in the transport line 60, the solar cell 11 is preferably transported with the light receiving surface facing upward. Thus, the solar cell 11 is transported into the alignment adjustment unit 35 in a state where the light receiving surface faces upward. In the alignment adjustment unit 35, the above-described positioning process is applied preferably using a camera 37.

The inspection unit 36 is provided proximate to the downstream side (end point side of the manufacturing line) of the application and inversion unit 31, and preferably inspects an application state of the adhesive 47a on the light receiving surface side (hereinafter also referred to as "quality inspection"). As a specific example configuration, the application state of the adhesive 47a is acquired by a camera 38, and the inspection unit judges whether or not the adhesive 47a is applied on the target application position. In addition, the inspection unit 36 judges whether or not there is damage such as a fracture or a crack. When it is determined as appropriate, that is, when there is no damage and the adhesive 47a is applied at the target position (in which case, it can be presumed that the adhesive 47b is also applied to the target position), the solar cell 11 is transported to the next step. On the other hand, when there is damage or the adhesive 47a is deviated from the target position, for example, the solar cell 11 is discarded.

As described above, the control device 32 preferably integrally controls the operations of the constituting elements of the present system. The control device 32 includes a storage unit 50 that stores, for example, a database, a program, or the like necessary for realizing the function. In addition, the control device 32 includes, as control blocks, for example, an alignment controller 51, a first inversion controller 52, a first application controller 53, a second inversion controller 54, a second application controller 55, and an inspection and judgment unit 56. The functions of the control device 32 may be distributed over a plurality of hardware structures. All of the application steps of the adhesive 47 may be automatically executed by the function of the control device 32, or some of the steps may be manually executed.

The control device 32 controls the operations of the application devices 33a and 33b, and the inversion device 34, to invert the solar cell 11 placed with the light receiving surface facing upward so that the back surface faces upward, to apply the adhesive 47 over the back surface and to then again invert the solar cell 11 so that the light receiving surface faces upward, and to apply the adhesive 47 over the light receiving surface. In the present embodiment, this control is executed by the functions of the first inversion controller 52, the first application controller 53, the second inversion controller 54, and the second application controller 55. In addition, the control device 32 adjusts the alignment with reference to the light receiving surface side of the solar cell 11. This control is executed by the function of the alignment controller 51. Further, after the adhesive 47 is applied, the control device 32 executes the quality inspection for the light receiving surface side. This control is executed by the function of the inspection and judgment unit 56.

As described above, the application system 30 executes inversion operations twice, after the alignment adjustment and before the quality inspection. The solar cell 11 is inverted in the application and inversion unit 31 before application of the adhesive 47, and inverted again after the application of the adhesive 47 over the back surface and before the application of the adhesive 47 over the light receiving surface. Thus, both a transport-in surface and a transport-out surface are the light receiving surface. The "transport-in surface" refers to the surface facing upward when the solar cell 11 is transported into the application and inversion unit 31, and the "transport-out surface" refers to the surface facing upward when the solar cell 11 is transported out of the application and inversion unit 31. The detailed operation and operational advantages thereof of the application system 30 will be described in detail with reference to the manufacturing process to be described later.

The manufacturing process of the solar cell module 10 will now be described in detail with reference primarily to the application step of the adhesive 47 using the application system 30.

In the manufacturing process of the solar cell module 10, first, a plurality of solar cells 11 are prepared. The solar cell 11 can be manufactured by a method known in the related art (the detailed description of the method will not be given in this disclosure). A plurality of the solar cells 11 are supplied to the present manufacturing line, and, for example, are inspected for presence or absence of damage such as a fracture or a crack before the adhesive 47 is applied. Solar cells 11 that have passed the inspection are transported by a transport line 60 to the alignment adjustment unit 35.

As described above, because the solar cell 11 is preferably transported in a state where the light receiving surface faces upward, the solar cell 11 is transported into the alignment adjustment unit 35 in a state where the light receiving surface faces upward. In addition, for the application state of the adhesive 47, a high precision is required particularly at the light receiving surface side. For example, when the application position of the adhesive 47 is deviated from the target position, the light blockage loss would become large, and the appearance may become inferior. Such an effect is more significant at the light receiving surface side. Therefore, the above-described positioning process is executed with reference to the light receiving surface side.

In the alignment adjustment unit 35, the positioning process is executed with reference to the light receiving surface side of the solar cell 11 using the camera 37 which captures an image from above the solar cell 11, for enabling application of the adhesive 47 at the target application position. The positioning process is executed by a function of the alignment controller 51. The solar cell 11 for which the positioning process is completed is transported to the application and inversion unit 31 with the light receiving surface serving as the transport-in surface.

In the following, the step in the application and inversion unit 31 will be described.

First, the solar cell 11 for which the above-described positioning process is completed is transported to the inversion device 34, and the solar cell 11 is inverted so that the back surface faces upward. In other words, the solar cell 11 is first inverted before the adhesive 47 is applied. In the present application step, as described above, the inversion operation is executed twice in the application and inversion unit 31 between the alignment adjustment and the quality inspection. Therefore, with the above-described inversion operation, the number of inversion operations after the application of the adhesive 47 is one.

The inversion operation of the first time is executed by a function of the first inversion controller 52. The method of inversion is not particularly limited so long as the effect on the positional precision or the like is small, and is suitably selected according to the device space or the like (this applies similarly to the second inversion). The solar cell 11 for which the inversion operation of the first time is completed is transported to the application device 33b.

Then, the adhesive 47 is applied over the back surface which is caused to face upward by the inversion operation. The adhesive 47 is applied over the electrode along the longitudinal direction of the bus bar electrode 23b. Preferably, the adhesive 47 is applied with a slightly wider width than the width of the bus bar electrode 23b. In the application device 33b, the solar cell 11 is placed on the stage 40b in a state where the back surface faces upward, and the adhesive 47 is applied by a function of the first application controller 53. In the application device 33b, the adhesive 47 is preferably applied by screen printing. The solar cell 11 over the back surface of which the adhesive 47 is applied is transported again to the inversion device 34.

Next, the solar cell 11 over the back surface of which the adhesive 47 is applied is inverted again so that the light receiving surface faces upward. That is, the back surface over which the adhesive 47 is applied is caused to face downward (stage side of the inversion device 34). Because the adhesive 47b is in a non-cured state, it is necessary to invert the solar cell 11 in a manner to prevent attachment of the adhesive 47b to the stage and also prevent flowing of the adhesive 47b. As a countermeasure for the former, a method of providing an attachment prevention structure on the stage similar to the groove 41a may be considered. As a countermeasure for the latter, in addition to slowing down the inversion speed, a method may be considered to increase the viscosity of the adhesive 47 by providing a cooling means on the stage such as, for example, a means to blow air to the solar cell 11, or a cooler. When the viscosity of the adhesive 47 is increased at the time of inversion by providing the cooling means, even an adhesive 47 having a low viscosity at the normal temperature may be easily used.

The second inversion operation is executed by a function of the second inversion controller 54. The solar cell 11 for which the inversion operation of the second time is completed is transported to the application device 33a. Thus, in the present application step, the two inversion operations are completed before the adhesive 47 is applied over the light receiving surface.

Then, the adhesive 47 is applied over the light receiving surface which is caused to face upward by the inversion operation. The adhesive 47 is applied over the electrode along the longitudinal direction of the bus bar electrode 23a. Preferably, the adhesive 47 is applied in a slightly wider width than the width of the bus bar electrode 23a.

In the application device 33a, the solar cell 11 is placed on the stage 40a in a state where the light receiving surface faces upward, and the adhesive 47 is applied over the light receiving surface by a function of the second application controller 55. The groove 41a is provided on the stage 40a to prevent attachment of the adhesive 47b, and the solar cell 11 is placed with the adhesive 47b aligned with the position of the groove 41a. In the application device 33a, the adhesive 47 is preferably applied by screen printing, similar to the back surface side.

As described above, the application of the adhesive 47 over the light receiving surface is executed after completion of the inversion operations twice. In other words, after the adhesive 47 is applied over the light receiving surface, the solar cell 11 is not inverted. Because of this, positional deviation due to flowing of the adhesive 47a caused by the inversion operation does not occur, and the adhesive 47a can be provided at the target position with a high precision. With regard to the adhesive 47b which is applied earlier also, because there is only one inversion operation after the application, the effect of the inversion operation can be inhibited compared to a case where inversion operations are executed twice after the application of the adhesive.

The solar cell 11 over the light receiving surface of which the adhesive 47 is applied is transported out of the application and inversion unit 31 without being inverted, and is transported to the inspection unit 36. With this process, the solar cell 11 is transported to the inspection unit 36 in a state where the light receiving surface faces upward. In other words, in the present application step, the transport-in surface and the transport-out surface of the application and inversion unit 31 are unified with the light receiving surface.

Finally, in the inspection unit 36, the application state of the adhesive 47 is inspected, and the sequence of the application process in the application system 30 is completed. In the inspection unit 36, the light receiving surface side for which a high precision is desired is inspected for quality. In the inspection unit 36, with a function of the inspection and judgment unit 56, for example, the application state of the adhesive 47a is acquired by the camera 38, and it is judged whether or not the adhesive 47a is applied to the target application position and whether or not there is damage such as a fracture or a crack. The solar cell 11 that has passed the inspection is transported to the next step.

As shown in FIG. 5, in the next step, the wiring member 15 is attached to the solar cell 11 on which the adhesive 47 is applied. The flat surface of the wiring member 15 is adhered on the adhesive 47a, and the surface with the unevenness 16 is adhered on the adhesive 47b. The wiring member 15 is thermally compressed over the adhesive 47, for example, and a heating temperature is set at a temperature at which the adhesive 47 is cured. The wiring member 15 may be separately adhered on the light receiving surface side and the back surface side of the solar cell 11, or alternatively, simultaneously adhered on the light receiving surface side and the back surface side. In this manner, a string in which a plurality of solar cells 11 are connected by the wiring member 15 is produced.

Next, the constitutent members of the solar cell module 10 including the above-described string are layered and thermally compressed. This process is called a lamination process. In the lamination process, a first resin film forming the encapsulant 14 is layered over the protection member 12, and the string is layered over the first resin film. Further, a second resin film forming the encapsulant 14 is layered over the string, and the protection member 13 is layered thereover. While the structure is heated at a temperature at which the resin films melt, a pressure is applied to laminate the structure. In this manner, a structure in which the string is sealed by the encapsulant 14 is obtained. Finally, the frame, the terminal box, and the like are attached, to manufacture the solar cell module 10.

As described, according to the present manufacturing process, an appropriate application method of the adhesive 47 may be realized, and performance characteristics of the solar cell module 10 such as, for example, the photoelectric conversion characteristic and appearance, may be improved. In the present manufacturing process, the transport-in surface and the transport-out surface of the application and inversion unit 31 are unified with the light receiving surface. Because of this, it is possible to easily execute the alignment adjustment and quality inspection with reference to the light receiving surface side which more significantly affects the photoelectric conversion characteristic. Moreover, because the application of the adhesive 47 over the light receiving surface is executed after the completion of the inversion operations of two times, the effect of the inversion operation on the adhesive 47a can be removed. With such a configuration, even when an adhesive having a low viscosity is used as the adhesive 47, because the structure is not inverted after the adhesive 47 is applied over the light receiving surface, the adhesive 47a can be provided at the target position with a high precision.

Figure 8:
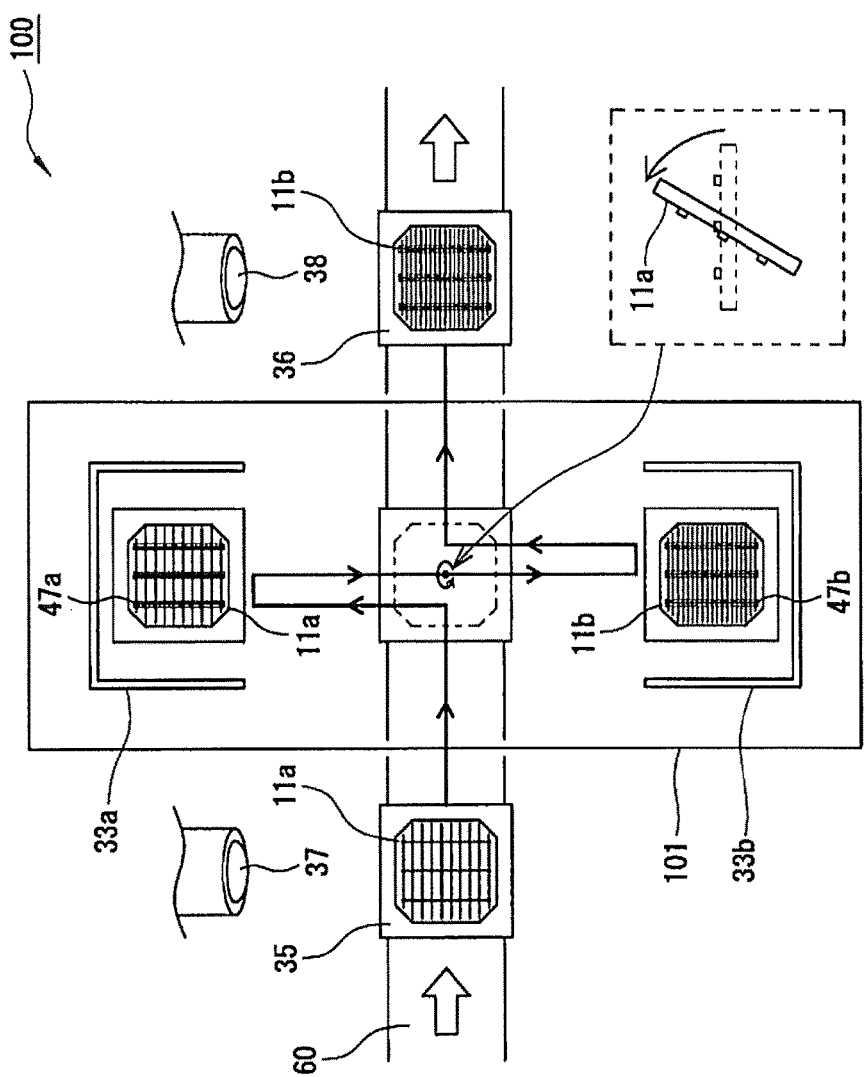
FIG. 8 is a diagram showing a referential example structure of a manufacturing process of a solar cell module and an adhesive application system.

On the other hand, in an application system 100 of a referential example structure shown in FIG. 8, there is a problem in the quality assurance (application precision) or the like compared to the preferred embodiment of the present invention. The application system 100 differs from the present embodiment in that the number of inversion operations at an application and inversion unit 101 is one. In this case also, the adhesive 47 may be applied on both surfaces of the solar cell 11, but the transport-out surface from the application and inversion unit 101 would be the back surface. Thus, the solar cell 11 is transported to the inspection unit 36 in a state where the back surface faces upward, and the quality inspection is executed for the back surface. That is, it becomes difficult to inspect the quality on the light receiving surface side for which a high precision is required. In addition, in the application system 100, because the transport-in surface and the transport-out surface are not unified, the alignment adjustment and the quality inspection are executed with reference to different surfaces, which is not preferable from the viewpoint of the application precision. Furthermore, when the application system 100 is used, the subsequent processes are executed in a state where the light receiving surface faces downward, which is not preferable also from the viewpoint of inhibiting damage and contamination on the light receiving surface side.

According to the present manufacturing process, the solar cell 11 is first inverted after the alignment adjustment, the adhesive 47 is applied over the back surface and then the solar cell 11 is inverted again, and the adhesive 47 is applied over the light receiving surface. With such a configuration, operational advantages that cannot be obtained by the other methods including the above-described referential example structure can be obtained. Alternatively, a method may be considered in which the transport-in surface and the transport-out surface are unified with the back surface. However, it can be understand from the above description that such a method is not appropriate when the solar cell 11 is used.

Figure 6:
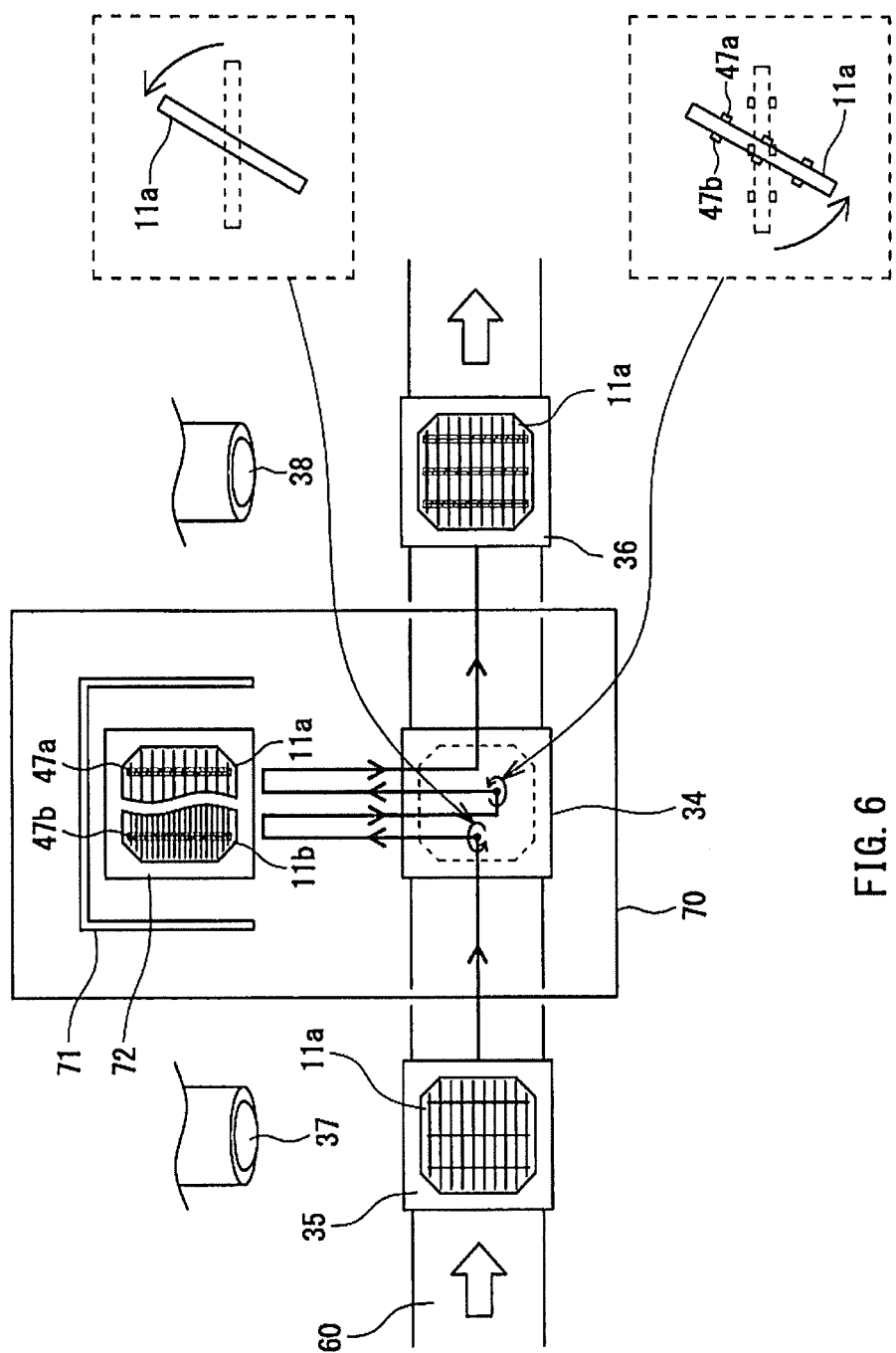
FIG. 6 is a diagram showing an alternative configuration of the manufacturing process and the adhesive application system of FIG. 3.

The above-described preferred embodiment may be changed in design within a range that does not lose the advantages of the present invention. For example, in the above-described preferred embodiment, two application devices 33a and 33b are used to apply the adhesive 47 over the light receiving surface and the back surface, respectively, but alternatively, as shown in FIG. 6, the adhesives 47 may be applied by one application device 71. In this case, it is preferable to form an attachment prevention structure of the adhesive 47b, similar to the groove 41a, on a stage 72 of the application device 71.

In addition, in the above-described preferred embodiment, the alignment adjustment unit 35 is provided upstream of the application and inversion unit 31, but alternatively, the alignment adjustment unit 35 may be provided within the application and inversion unit 31. More specifically, the alignment adjustment unit 35 may be provided downstream of the inversion device 34 that inverts the solar cell 11 so that the back surface of the solar cell 11 faces upward. Alternatively, the alignment adjustment unit 35 may also be provided downstream of the inversion of the solar cell 11 by the inversion device 34 so that the light receiving surface faces upward after the application of the adhesive 47 on the back surface side of the solar cell 11. In this manner, the alignment may be adjusted after the solar cell 11 is inverted, to enable application of the adhesive 47 on the target position with an even higher precision.

Figure 7:
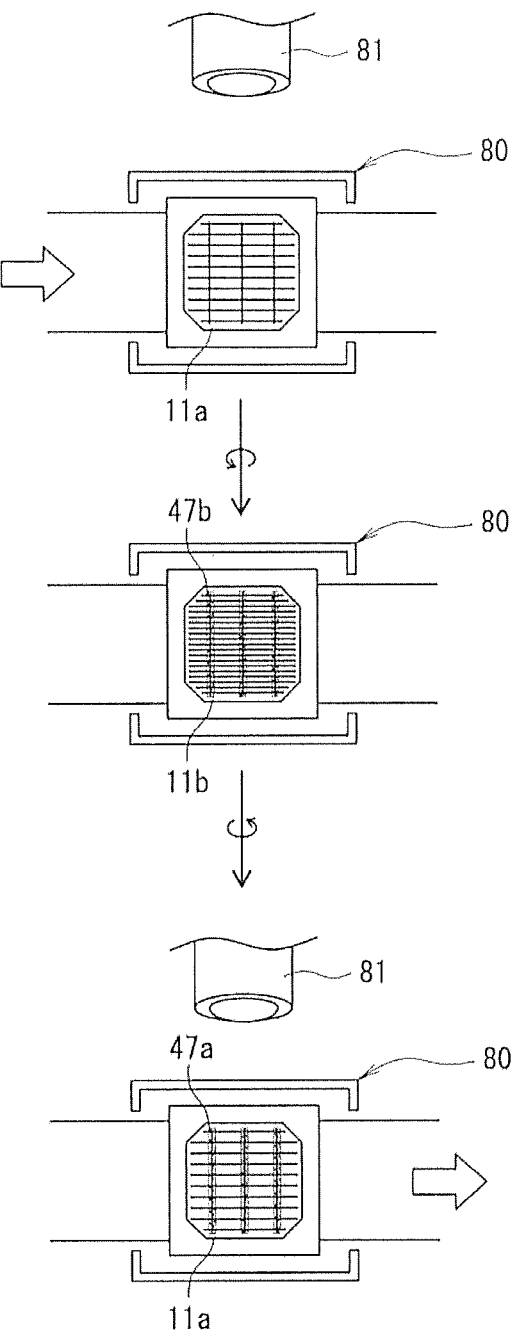
FIG. 7 is a diagram showing another alternative configuration of the manufacturing process and the adhesive application system of FIG. 3.

Alternatively, as shown in FIG. 7, the steps from the alignment adjustment to the quality inspection may be executed at one location. In an application and inversion unit 80 shown in FIG. 7, the application device and the inversion device are collected to one device. Further, a camera 81 is provided on the application and inversion unit 80, and the alignment adjustment and the quality inspection can be executed by this unit.

EXPLANATION OF REFERENCE NUMERALS

10 SOLAR CELL MODULE; 11 SOLAR CELL; 12, 13 PROTECTION MEMBER; 14 ENCAPSULANT; 15 WIRING MEMBER; 16 UNEVENNESS; 17, 47, 47a, 47b ADHESIVE; 20 PHOTOELECTRIC CONVERSION UNIT; 21a, 21b TRANSPARENT CONDUCTIVE LAYER; 22a, 22b FINGER ELECTRODE; 23a, 23b BUS BAR ELECTRODE; 30 ADHESIVE APPLICATION SYSTEM FOR SOLAR CELL MODULE; 31 APPLICATION AND INVERSION UNIT; 32 CONTROL DEVICE; 33a, 33b APPLICATION DEVICE; 34 INVERSION DEVICE; 35 ALIGNMENT ADJUSTMENT UNIT; 36 INSPECTION UNIT; 37, 38 CAMERA; 40a, 40b STAGE; 41a GROOVE; 42 SCREEN PLATE; 43 MESH; 44 MASK MEMBER; 45 OPENING; 46 SQUEEGEE; 50 STORAGE UNIT; 51 ALIGNMENT CONTROLLER; 52 FIRST INVERSION CONTROLLER; 53 FIRST APPLICATION CONTROLLER; 54 SECOND INVERSION CONTROLLER; 55 SECOND APPLICATION CONTROLLER; 56 INSPECTION AND JUDGMENT UNIT; 60 TRANSPORT LINE.

The invention claimed is:

1. An adhesive application system for a solar cell module that applies an adhesive for adhering a wiring member over a light receiving surface and over aback surface of a solar cell, the system comprising:

an application device that applies an adhesive over the light receiving surface and over the back surface;

an inversion device that inverts the solar cell; and a control device, wherein the control device controls operations of the application device and the inversion device to invert the solar cell placed with the light receiving surface facing upward so that the back surface faces upward, to apply the adhesive over the back surface and then invert the solar cell again so that the light receiving surface faces upward, and to apply the adhesive over the light receiving surface.

2. The system according to claim 1, wherein the solar cell is transported into the system with the light receiving surface facing upward, and, after the adhesive is applied over the back surface and the light receiving surface, is transported out of the system with the light receiving surface facing upward.

* * * * *